US008931924B2

(12) United States Patent
Lin et al.

(10) Patent No.: US 8,931,924 B2
(45) Date of Patent: Jan. 13, 2015

(54) HEAT SINK FOR LED LAMP

(75) Inventors: Ming-Te Lin, New Taipei (TW); Ming-Yao Lin, New Taipei (TW); Heng Qiu, New Taipei (TW)

(73) Assignee: Uniled Lighting Taiwan Inc., New Taiper (TW)

( * ) Notice: Subject to any disclaimer, the term of this patent is extended or adjusted under 35 U.S.C. 154(b) by 531 days.

(21) Appl. No.: 13/270,582

(22) Filed: Oct. 11, 2011

(65) Prior Publication Data

US 2013/0088875 A1 Apr. 11, 2013

(51) Int. Cl.
*F21V 29/00* (2006.01)
*F21K 99/00* (2010.01)
*F21V 3/02* (2006.01)
*F21V 3/00* (2006.01)

(52) U.S. Cl.
CPC ............. *F21V 29/2293* (2013.01); *F21V 3/005* (2013.01); *F21V 2101/02* (2013.01); *F21V 29/2237* (2013.01); *F21V 29/242* (2013.01); *F21V 29/246* (2013.01); *F21K 9/13* (2013.01); *F21V 3/02* (2013.01)
USPC ................. 362/294; 362/249.02; 362/249.06; 362/311.02; 362/373

(58) Field of Classification Search
CPC ........... F21K 9/00; F21K 9/30; F21V 29/004; F21V 29/2293
USPC ........... 362/249.02–249.06, 294, 311.02, 373
See application file for complete search history.

(56) References Cited

U.S. PATENT DOCUMENTS 7,234,842 B2 * 6/2007 Frederico ...................... 362/373
8,092,045 B2 * 1/2012 Xiao et al. ............... 362/249.02

* cited by examiner

*Primary Examiner* — Stephen F Husar
(74) *Attorney, Agent, or Firm* — Lowe Hauptman & Ham, LLP

(57) ABSTRACT

A LED lamp is disclosed which is composed of a plurality of light unit, each of the light unit has metal its leads inserted into a heat sink for heat dissipation. A circuit board is optionally to use for electrically coupling the metal leads of each light unit to a control circuit for controlling the on/off of each of the light units.

26 Claims, 24 Drawing Sheets

Fig.2A
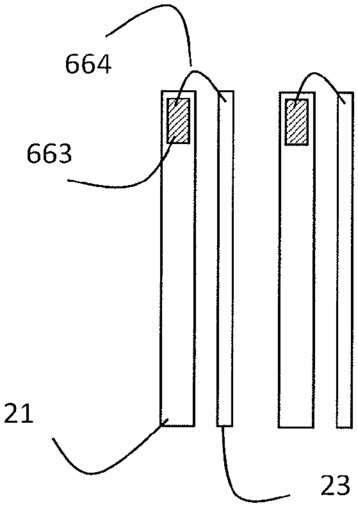
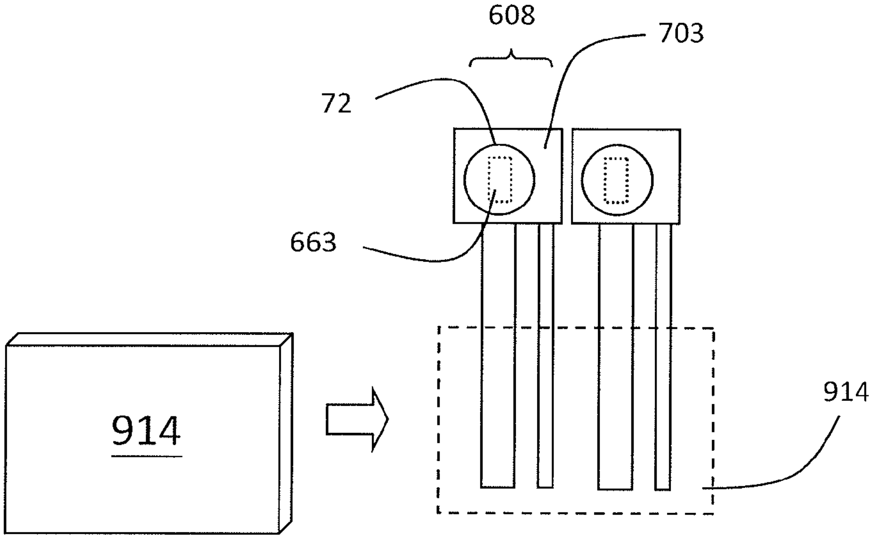
Fig.2B

Fig.3A
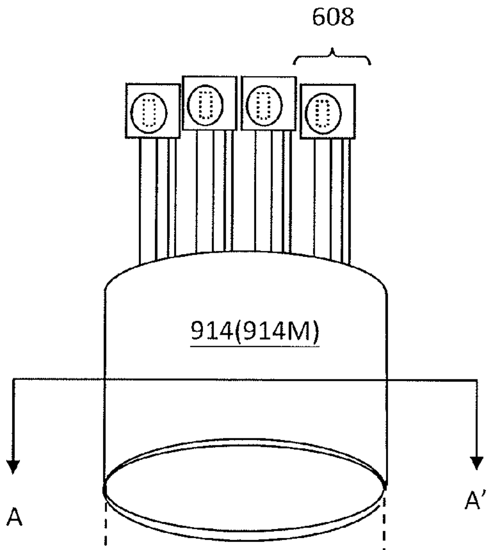
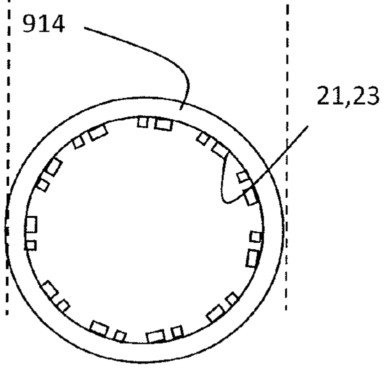
Fig.3B
Fig.3C
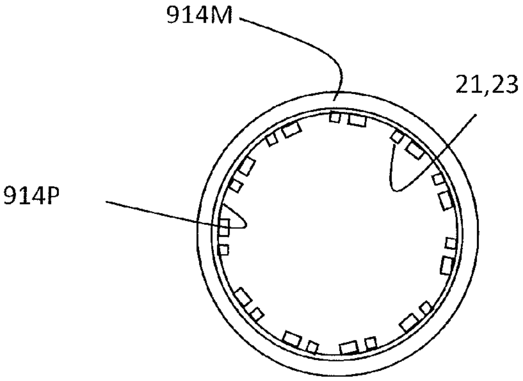

Fig.5A
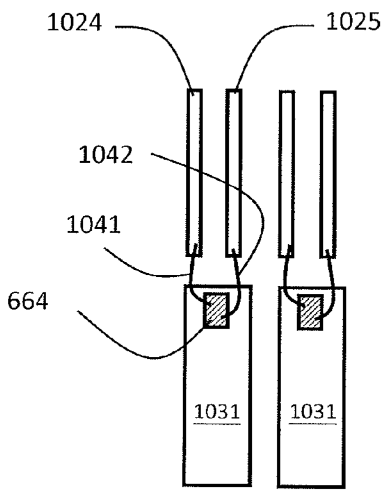
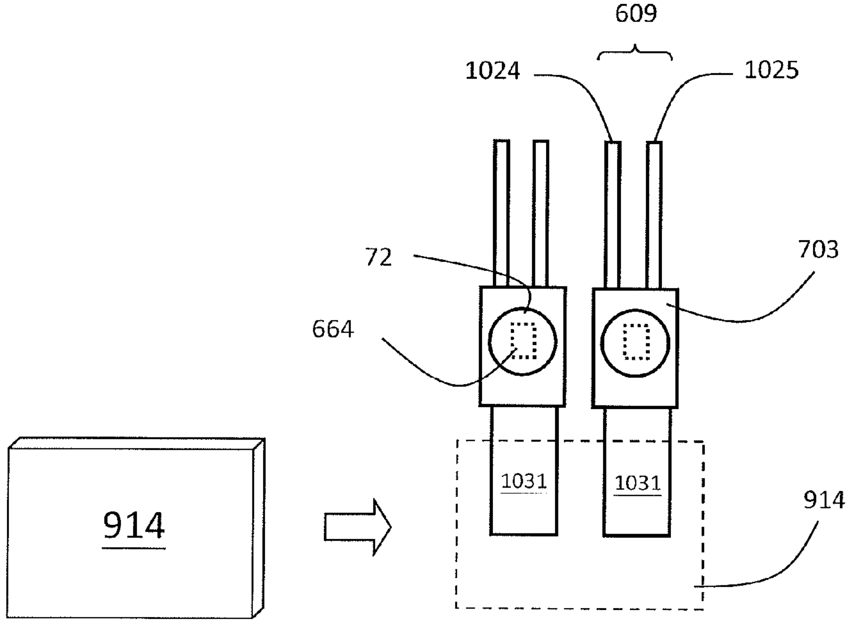
Fig.5B

Fig.6A
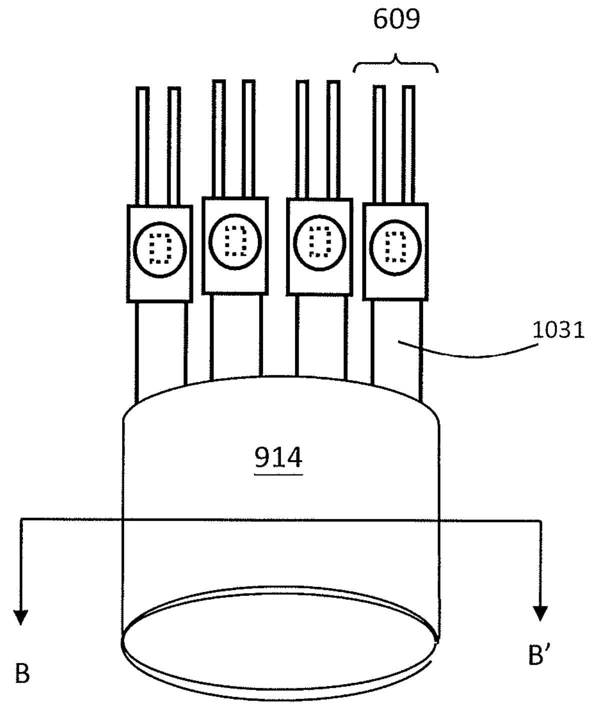
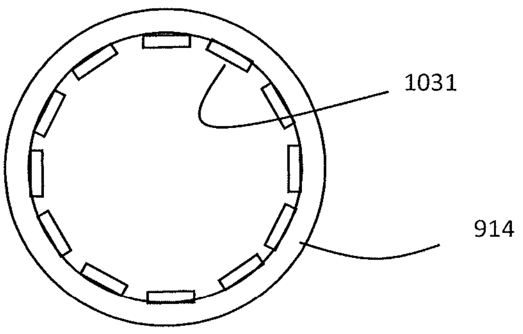
Fig.6B

Fig.9B
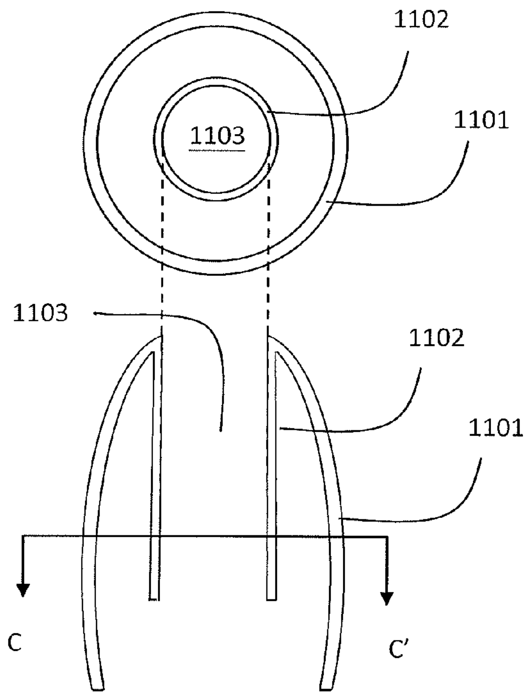
Fig.9A
Fig.9D
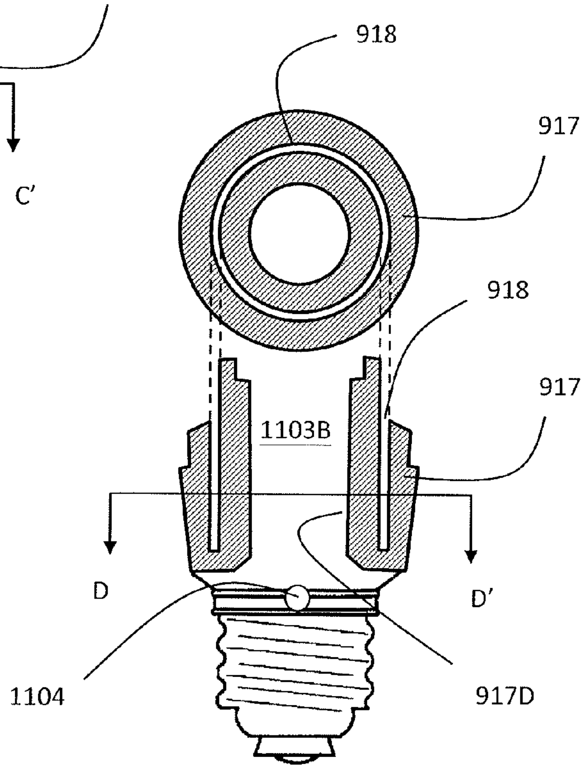
Fig.9C

Fig.10A
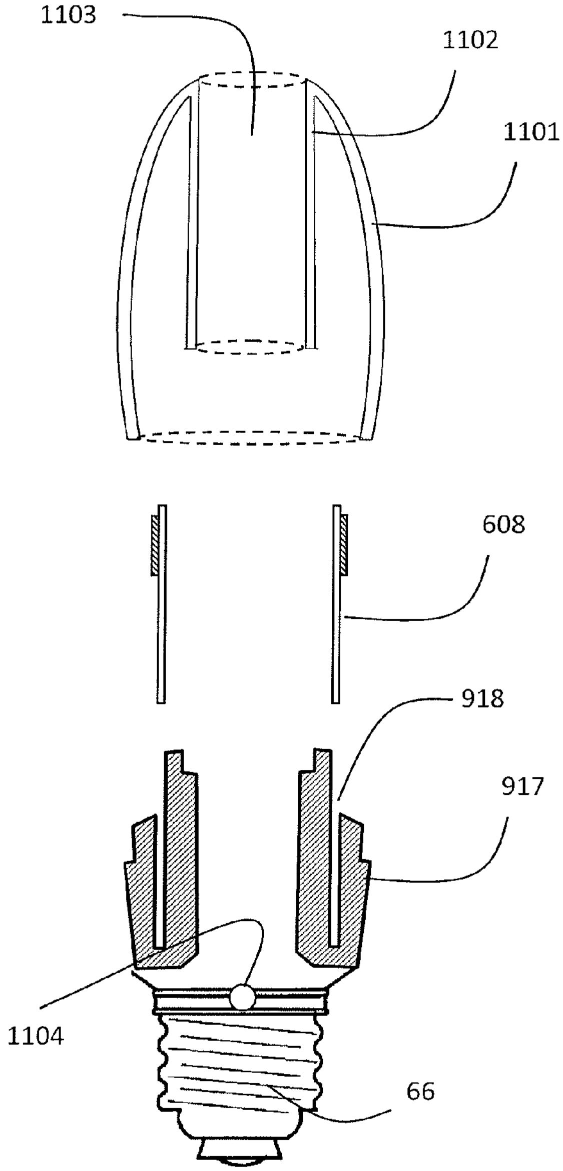
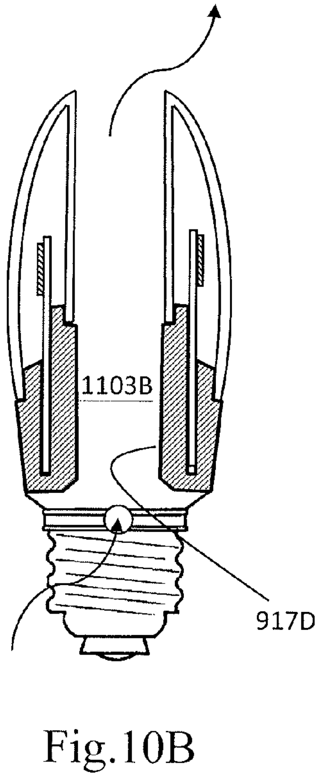
Fig.10B

Fig.15B
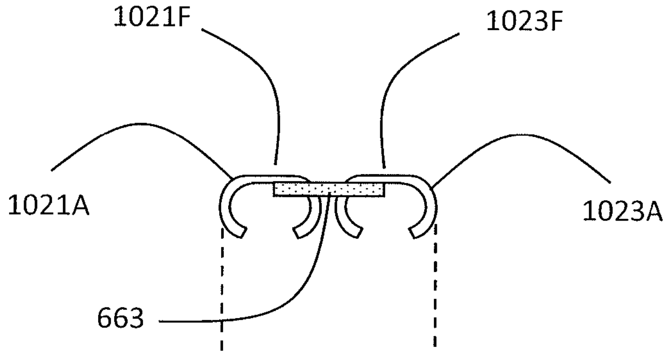
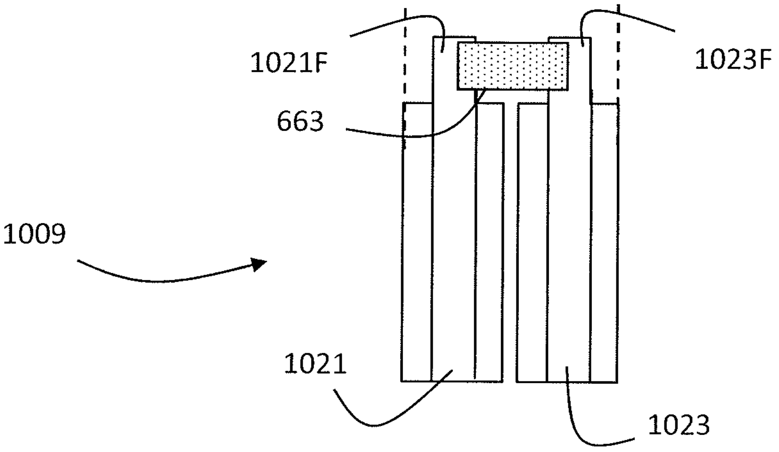
Fig.15A

Fig.16B
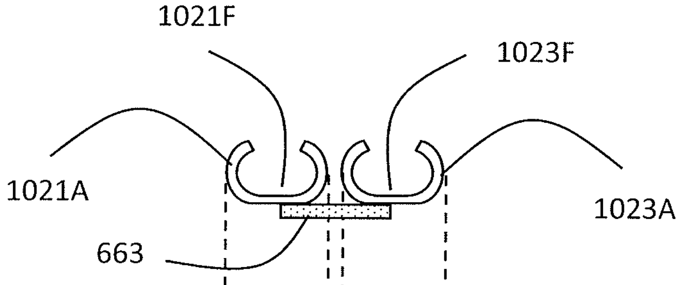
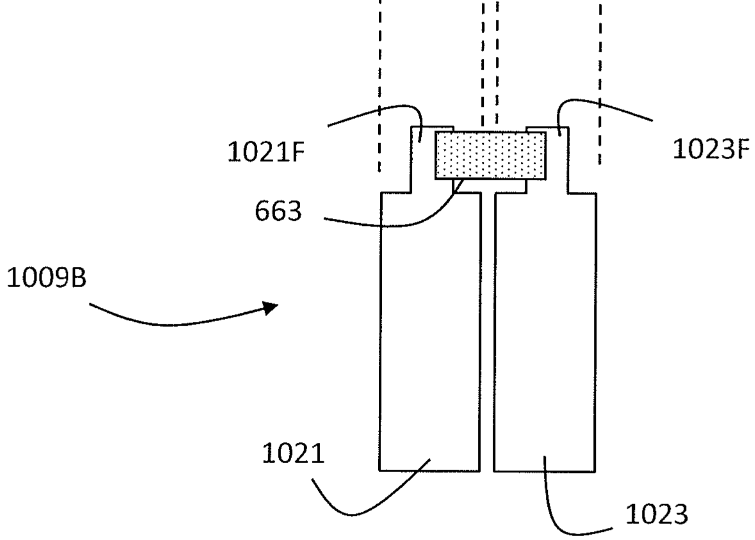
Fig.16A

Fig.19B
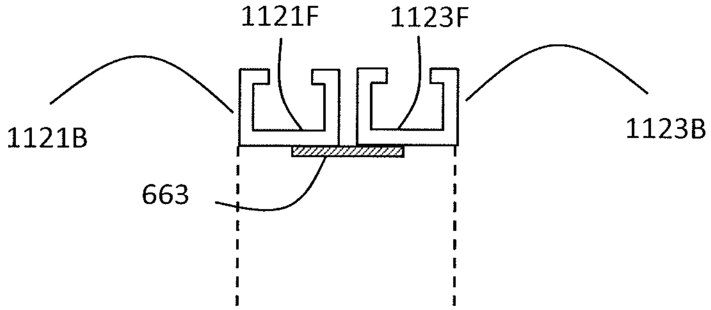
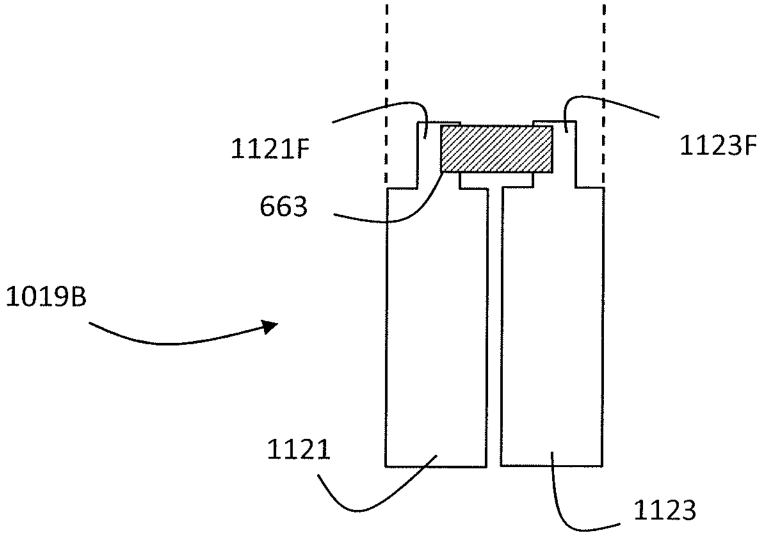
Fig.19A

Fig.22A
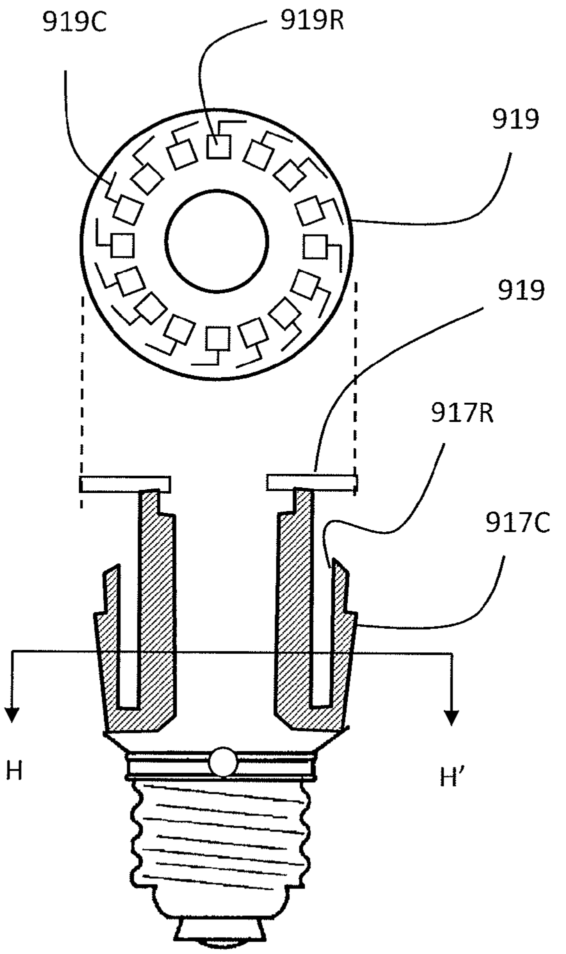
Fig.22B
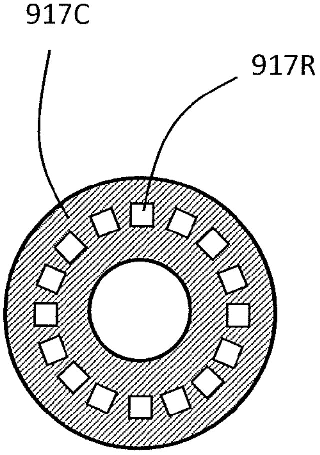
Fig.22C

Fig.23A
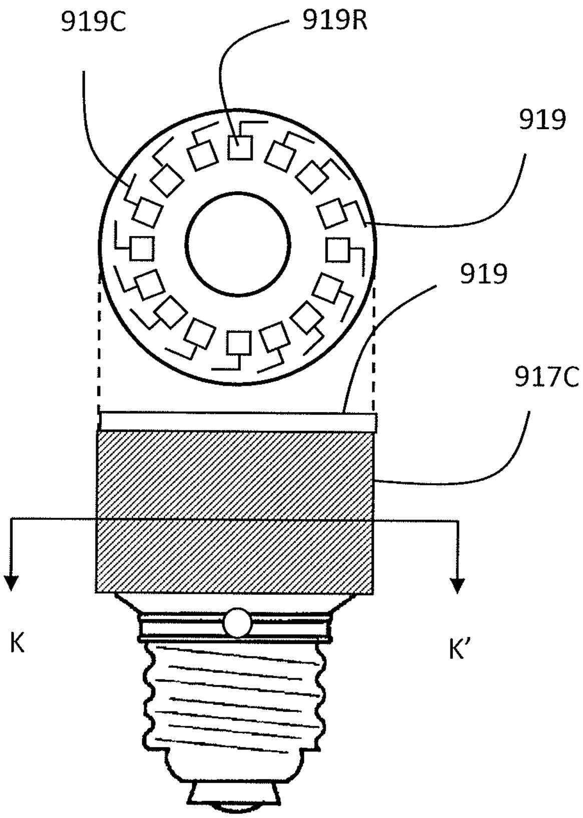
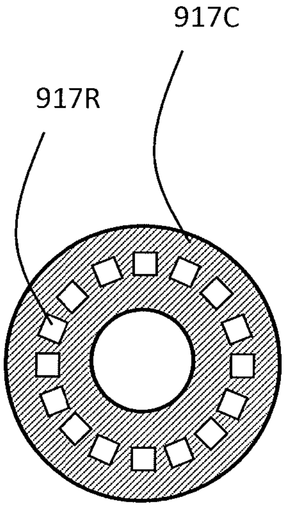
Fig.23C
Fig.23B

HEAT SINK FOR LED LAMP

BACKGROUND

1. Technical Field

The present invention relates to a lamp composed of LED light unit, especially to a heat sink attached to the lamp for heat dissipation. The heat sink can be made of ceramic material, or alternatively made of a metal coated with an insulation material between it and the metal leads of the light unit.

2. Description of Related Art

FIG. 1 is a prior art.

U.S. Pat. No. 7,434,964 discloses a lamp with a heat sink which includes a plurality of LED module mounted on periphery of a heat sink 30. Each of the LED modules includes a plurality of LED 54 mounted on a front side of a circuit board 52. A plurality of heat pipes 40 attached to interior of the heat sink 30. A bowl-shaped cover 20 attached to a bottom portion of the heat sink 30, a lamp seat 10 secured below the cover. The bulky of the heat sink 30 makes the lamp heavy and the heat pipes 40 advances the cost of the lamp. A simpler structure with better heat dissipation and cost down LED lamp is desirous to be conceived.

BRIEF DESCRIPTION OF THE DRAWINGS

FIGS. 2A~2B is a basic concept for a first lamp according to the present invention.

FIGS. 3A~3C is a basic structure for a first lamp according to the present invention.

FIGS. 5A~5B is a basic concept for a second lamp according to the present invention.

FIGS. 6A~6B is partial components for a second lamp according to the present invention.

FIGS. 9A~9D is partial components for a third lamp according to the present invention.

FIGS. 10A~10B shows a third lamp according to the present invention.

FIGS. 15A~15B is a further light unit according to the present invention.

FIGS. 16A~16B is a further light unit according to the present invention.

FIGS. 19A~19B is a further light unit according to the present invention.

FIGS. 22A~22C shows a tenth lamp according to the present invention.

FIGS. 23A~23C is a different view to the tenth lamp according to the present invention.

DETAILED DESCRIPTION OF THE INVENTION

Figure 1:
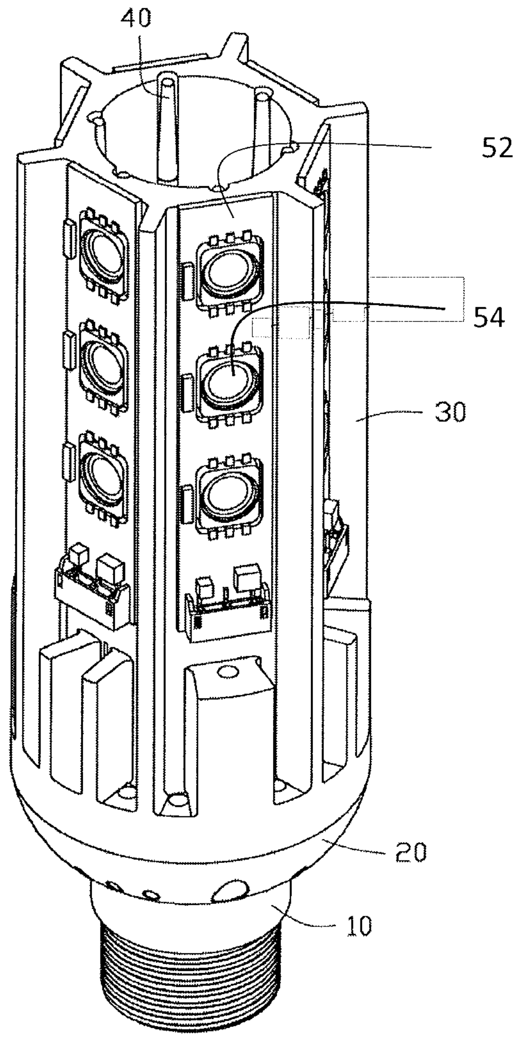
FIG. 1 is a prior art.

FIGS. 2A~2B is a basic concept for a first lamp according to the present invention.

FIG. 2A shows two light units as an example. Each light unit has a first flat lead 21 and a second flat lead 23 configured in parallel as two electrodes for the light unit. A light chip 663 mounts on the top of the first flat lead 21. The light chip 663 has a bottom electrode (not shown) electrically coupling to the first flat lead 21, a wire 664 bonds the top electrode of the chip 663 to the second flat lead 23. The light chip 663 radiates when the lead 21 and lead 23 are energized by a power supply (not shown).

FIG. 2B shows that a molding compound 703 wraps the light chip 663 and tops of the two leads 21, 23. A lens 72 is configured before the light chip 663 and exposes out of the molding compound 703 to modify the light beams emitted from the light chip 663 before going out of the light unit 608. A heat sink 914 is configured to contact with the first lead 21 and the second lead 23 for heat dissipation.

The first lead 21 and the second lead 23 may be prepared from a flat metal sheet, for example, like the process to prepare a traditional lead frame for an Integrated Circuit. In this way, the first lead 21 has a front surface coplanar with the front surface of the second lead 23. FIG. 2B shows that the heat sink 914 has a backside surface contacting the lower portion of the first lead 21 and the second lead 23 so that the heat generated from the light chip 663 can be conducted to the heat sink 914 through the leads 21, 23.

FIG. 3A~3C is a basic structure for a first lamp according to the present invention.

FIG. 3A shows that a circular wall heat sink 914 is made of ceramic and has an inner surface and an outer surface. The leads 21, 23 attach to the inner surface of the heat sink 914.

FIG. 3B is a section view of FIG. 3A according to line AA'. It shows that the leads 21, 23 of the light unit 608 are attached to the inner surface of the heat sink 914.

FIG. 3C shows that the heat sink 914M can be made of metal, an insulation layer 914P is coated on the inner surface of the heat sink 914M so that the leads 21, 23 of the light unit 608 maintain electrically independent between them and the metal heat sink 914M.

Figure 4:
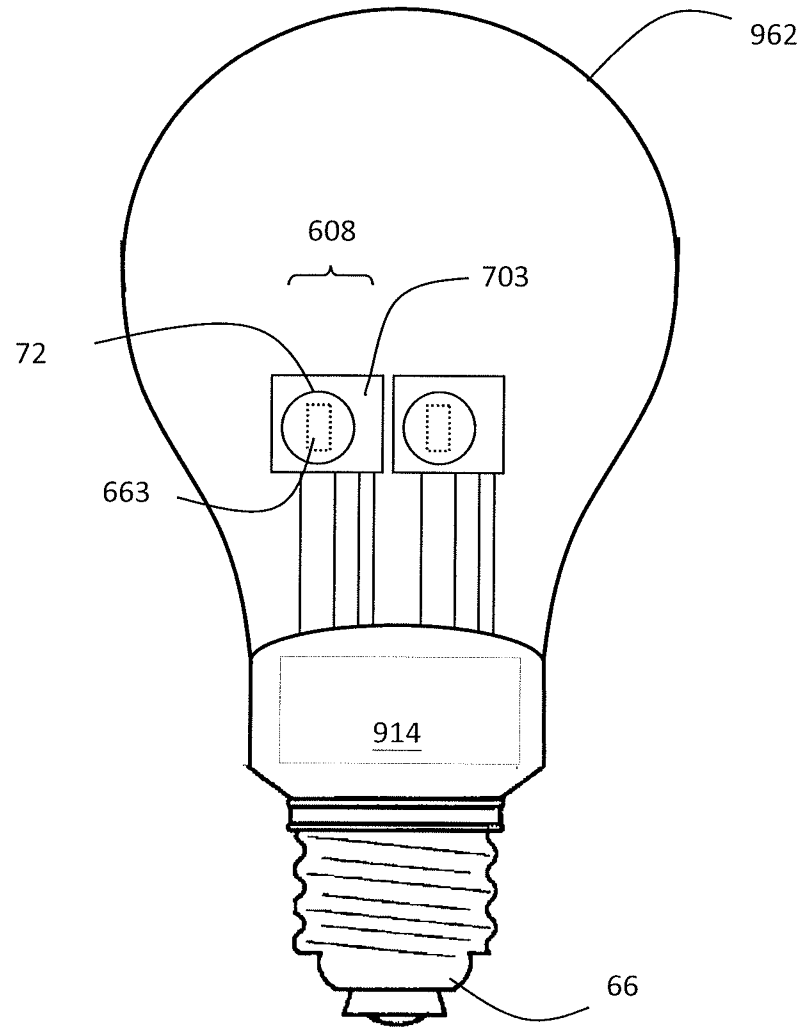
FIG. 4 shows a first lamp according to the present invention.

FIG. 4 shows a first lamp according to the present invention.

FIG. 4 shows that a transparent bulb 962 is configured on top of the heat sink 914. The light units 608 are enclosed inside the bulb 962. A lamp base 66 is configured under the heat sink 914 so that the lamp bulb of FIG. 4 can be screwed into a traditional lamp socket (not shown).

FIGS. 5A~5B is a basic concept for a second lamp according to the present invention.

FIG. 5A shows that a pair of light units 609 is prepared as an example, leads 1024, 1025 are prepared in parallel, a light chip 664 is mounted on top of a metal slug 1031. A first wire 1041 bonds a first top electrode of the chip 664 onto the first lead 1024, and a second wire 1042 bonds a second top electrode of the chip 664 onto the second lead 1025.

FIG. 5B shows that a molding compound 703 wraps the light chip 664, the top of the metal slug 1031, the wires 1041, 4042, and the bottom of the leads 1024, 1025 in position. A lens 72 is mounted before the light chip 664 and exposes out of the molding compound 703 to modify the light beams emitted from the light chip 664 before going out of the light unit 609. The light chip 664 radiates when the leads 1024, 1025 are energized by a power supply (not shown). A heat sink 914 is configured to contact with the metal slug 1031 for a further heat dissipation.

FIG. 5B shows that the heat sink 914 has a backside surface contacting the metal slug 1031 so that the heat generated from the chip 664 can be conducted to the heat sink 914 through the metal slug 1031.

FIG. 6A~6B is partial components for a second lamp according to the present invention.

FIG. 6A shows that a circular wall heat sink 914 is made of ceramic or equivalent and has an inner surface and an outer surface. The metal slugs 1031 of each light unit 609 attaches to the inner surface of the heat sink 914.

FIG. 6B is a section view of FIG. 6A according to line BB'. It shows that the metal slug 1031 of each light unit 609 is attached to the inner surface of the heat sink 914 for heat dissipation.

Figure 7:
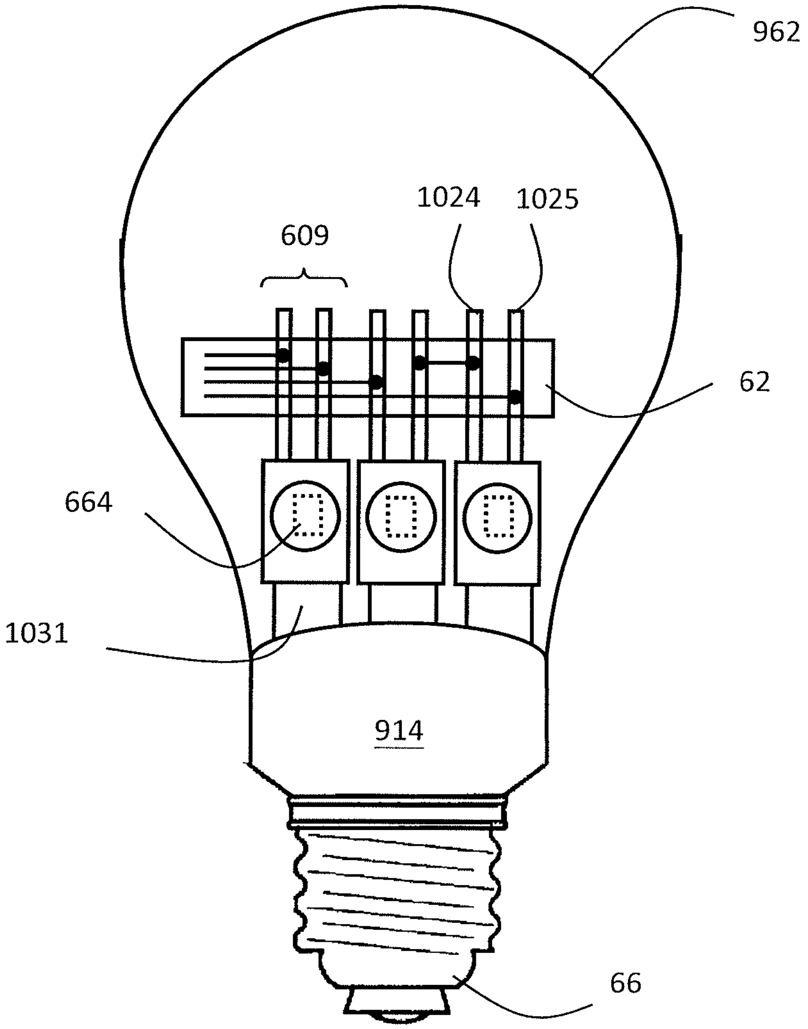
FIG. 7 shows a second lamp according to the present invention.

FIG. 7 shows a second lamp according to the present invention.

FIG. 7 shows that a transparent bulb 962 is configured on top of the heat sink 914. The light units 609 are enclosed inside the bulb 962. A lamp base 66 is configured under the heat sink 914 so that the lamp bulb of FIG. 7 can be screwed into a traditional lamp socket (not shown).

A flexible circuit board 62 can be attached onto the leads 1024, 1025. A plurality of circuit is made on the flexible circuit 62, one of the circuit has a first end electrically coupling to one of the leads 1024, 1025, and has a second end electrically coupling to a power (not shown) so that the light unit 609 can be controlled on/off independently through a control circuit (not shown).

Figures 8A, 8B:
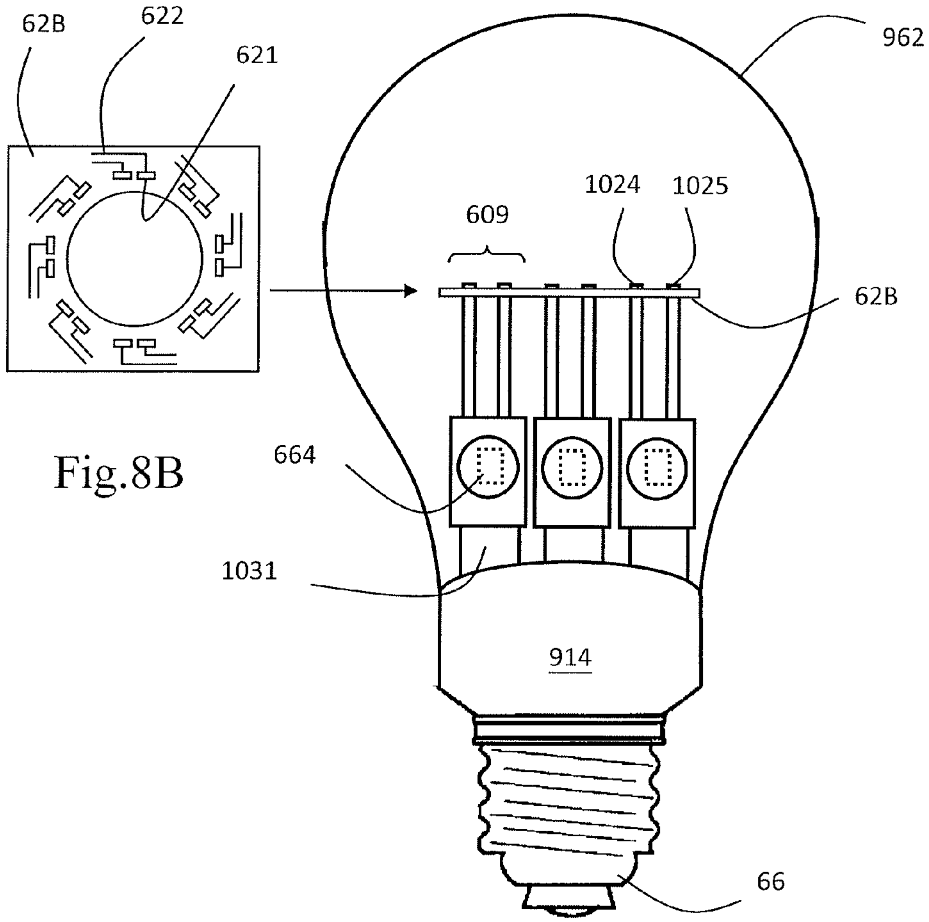
FIGS. 8A~8B is a modification structure for the third lamp according to the present invention.

FIGS. 8A~8B is a modification structure for the third lamp according to the present invention.

FIG. 8A shows that a hard circuit board 62B can be mounted on the top of the leads 1024, 1025. A plurality of through hole 621 is made on the hard circuit board 62B for an insertion of the leads 1024, 1025. A plurality of circuit 622 is configured on the circuit board 62B. Each circuit 622 has a first end electrically couples to one of the leads 1024, 1025 which is inserted in the hole 621, and has a second end electrically to a control circuit so that the light unit 609 can be controlled on/off independently through a control circuit (not shown).

FIG. 8B shows that the hard circuit board 62B has a plurality of through hole 621 made in a shape conforming to a section contour of the leads 1024, 1025. Each circuit 622 is made to electrically couple the inserted lead to a control circuit (not shown).

FIGS. 9A~9B is partial components for a third lamp according to the present invention.

FIG. 9A shows that a transparent elliptical cap 1101 with an inner tube 1102 is used as a protection for the light units in the lamp according to the present invention. A center passage 1103 is formed in the longitudinal center of the cap 1101 for an air passage.

FIG. 9B is a section view of FIG. 9A according to line CC'. FIG. 9B shows a center passage 1103 is formed in the longitudinal center of the cap 1101.

FIG. 9C shows that a heat sink 917 has an inner circular wall and an outer circular wall. A center passage 1103B is formed in the longitudinal center of the heat sink 917. A slit 918 is formed in between the inner circular wall and the outer circular wall. A lamp base 66 is configured under the heat sink 917. A hole 1104 is made in a position under the heat sink 917 communicating with the center passage 1103B.

FIG. 9D is a section view of the heat sink 917 according to line DD'. FIG. 9D shows a circular slit 918 is formed in between the two circular walls of the heat sink 917. The circular slit 918 is configured for an insertion of metal leads of a light unit. In a further embodiment, the circular slit 918 is configured for an insertion of metal slug of a light unit.

FIGS. 10A~10B shows a third lamp according to the present invention.

FIG. 10A is an explosion drawing for the third lamp. A cap 1101 is on the top, a plurality of light unit 608 is in the middle, a heat sink 917 in combination with a lamp base 66 is on the bottom; waiting to be assembled into the third lamp.

FIG. 10B is the assembly of the components shown in FIG. 10A. The plurality of light unit 608 inserts into the circular slit 918 with its leads 21, 23. The cap 1101 is configured on the top of the heat sink 917. A lamp base 66 is configured on the bottom of the heat sink 917. The space inside the cap 1101 encloses the light units 608 from ambient dust contamination. The center passage 1103B of the heat sink 917 aligns with the center passage 1103 of the cap 1101, and communicates with the hole 1104 forming a full air passage. The inner wall surface 917D of the heat sink 917 exposes along the air passage 1103B so that the heat from the heat sink 917 can be carried away while the cool air enters the hole 1104 and passes through the center passages 1103B, 1103 and exits on top.

Figure 11:
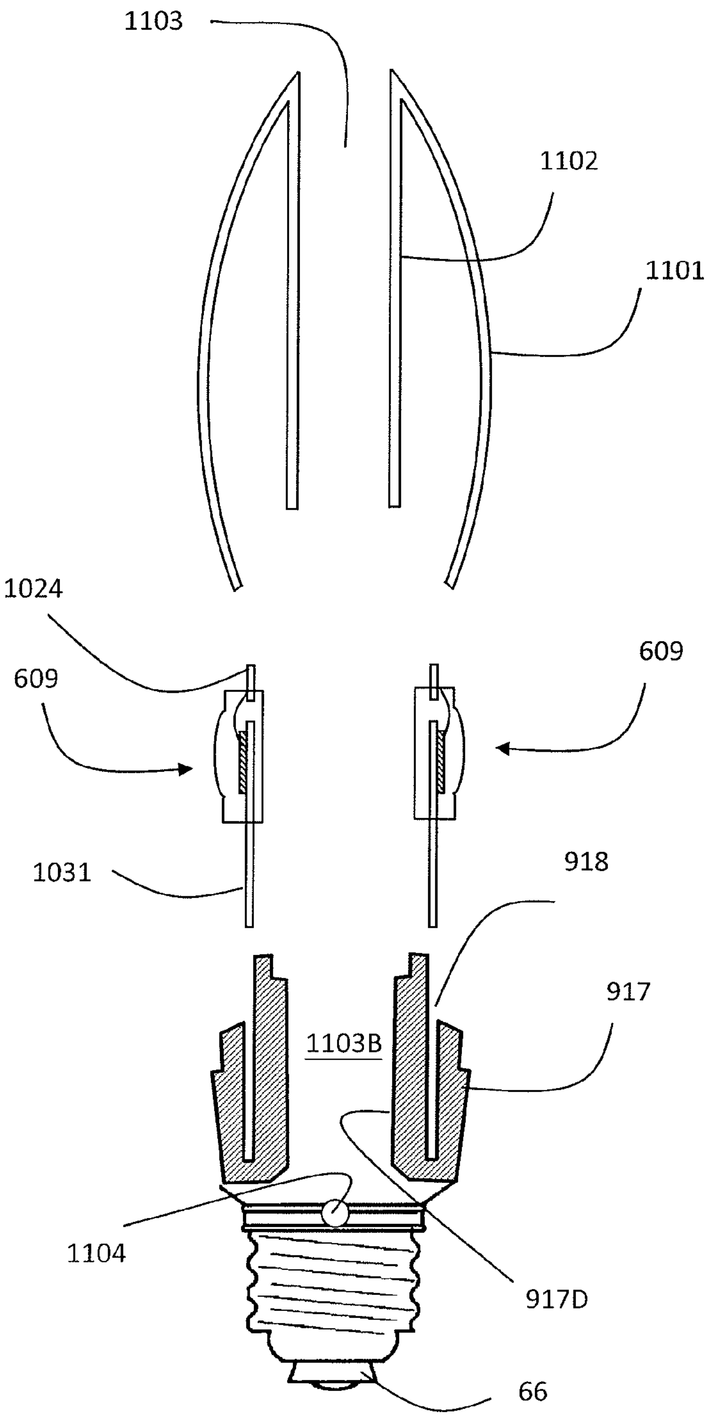
FIG. 11 is an explosion drawing for a fourth lamp according to the present invention.

FIG. 11 is an explosion drawing for a fourth lamp according to the present invention.

FIG. 11 shows that a transparent elliptical cap 1101 is on the top, a plurality of light unit 609 is in the middle, a heat sink 917 in combination with a lamp base 66 is on the bottom; waiting to be assembled into a fourth lamp.

Figure 12:
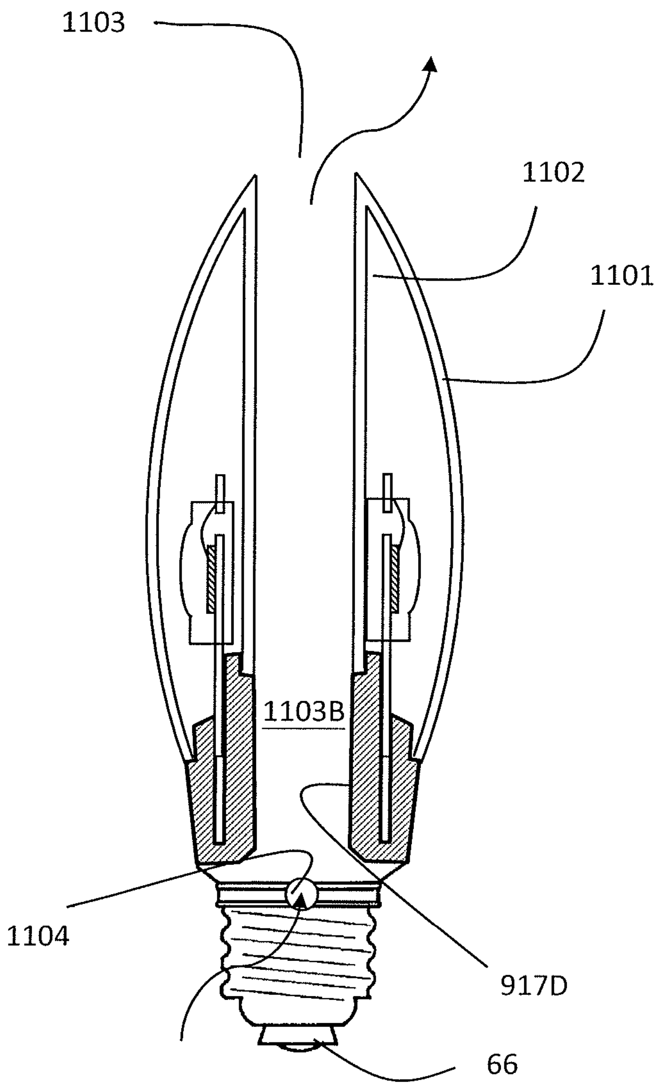
FIG. 12 is the fourth lamp according to the present invention.

FIG. 12 is the fourth lamp according to the present invention.

FIG. 12 is the assembly of the components shown in FIG. 11. The plurality of light unit 609 inserts into the circular slit 918 with its metal slug 1031. The rest structure is similar to the description for FIG. 10B.

Figures 13A, 13B:
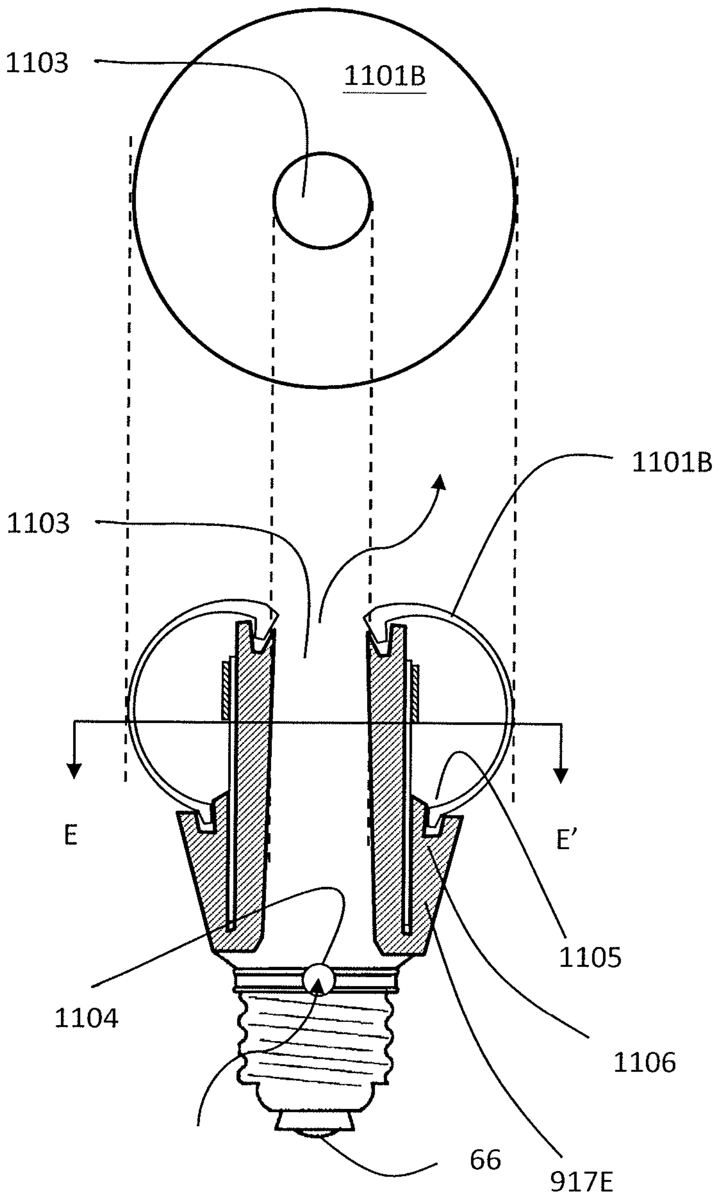
FIGS. 13A~13B is a fifth lamp according to the present invention.

FIGS. 13A~13B is a fifth lamp according to the present invention.

FIG. 13A is a section view of FIG. 13B according to line EE'. FIG. 13A shows a donut circle 1101B having a center passage 1103.

FIG. 13B is a lamp similar to the one shown in FIG. 10B. The only difference is that the transparent cap 1101B has a contour of a donut shape on top view and is different from the one in FIG. 10B where the transparent cap 1101 has a contour of an elliptical shape in side view. The donut cap 1101B has a bump end 1105 on each of its two ends, and the heat sink 917E has a first recess 1106 on a top of the outer circular wall and a second recess 1106 on a top of the inner circular wall. Each of the recesses 1106 is structurally engaged to one of the bump ends 1105 for fixing the cap 1101B in position firmly.

Figure 14A:
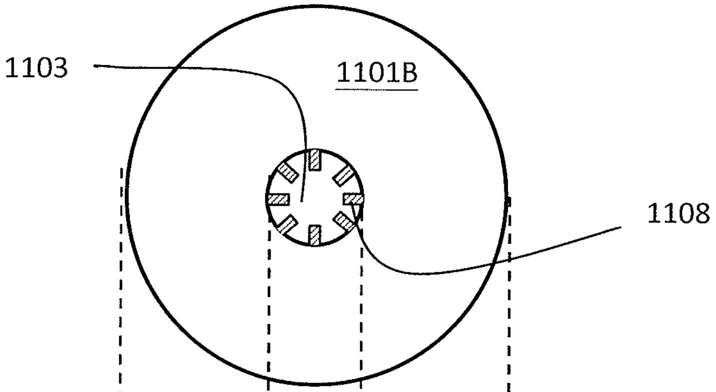
FIGS. 14A~14B is a sixth lamp according to the present invention.
Figure 14B:
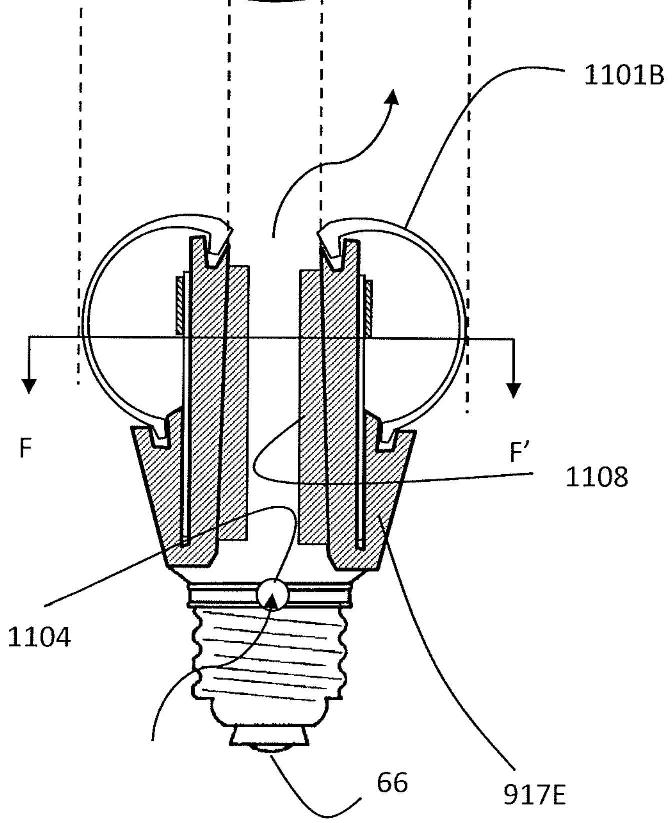

FIGS. 14A~14B is a sixth lamp according to the present invention.

FIG. 14A is a section view of FIG. 14B according to line FF'. FIG. 14A shows that a plurality of fin 1108 extends toward the center passage 1103.

FIG. 14B is a vertical section view of the sixth lamp according to the present invention. FIG. 14B is a lamp similar to the one as shown in FIG. 13B. The difference is that a plurality of fin 1108 is made and extends toward the center passage from the inner wall surface of the heat sink 917E in FIG. 14B.

FIGS. 15A~15B is a further light unit according to the present invention.

FIG. 15A is a light unit 1009 which has a first lead 1021 and a second lead 1023. A light chip 663 straddles a flat top of the lead 1021 and a flat top of the lead 1023.

FIG. 15B is a top view of FIG. 15A. FIG. 15B shows the first lead 1021 has a flat top 1021F and two arc arms 1021A. A first arc arm 1021A extends from a left side of the flat top 1021F, the other arc arm 1021A extends from a right side of the flat top 1021F. Similarly, the second lead 1023 has a flat top 1023F and two arc arms 1023A, a first arc arm 1023A extends from a left side of the flat top 1023F, the other arc arm 1023A extends from a right side of the flat top 1023F.

FIGS. 16A~16B is a further light unit according to the present invention.

FIG. 16A is a light unit 1009B similar to the one shown in FIG. 15A. A light chip 663 straddles a flat top of the lead 1021 and a flat top of the lead 1023.

FIG. 16B is a top view of FIG. 16A. FIG. 16B is similar to the one shown in FIG. 15B. The difference is that each of the arms bent in opposite direction as compared in FIG. 15A. FIG. 16A shows that a light chip 663 straddles on both flat tops of the leads 1021, 1023. FIG. 16B shows that the arc arm 1021A, 1023A bends backwards, i.e. away from the light chip 663.

Figures 17A, 17B, 17C:
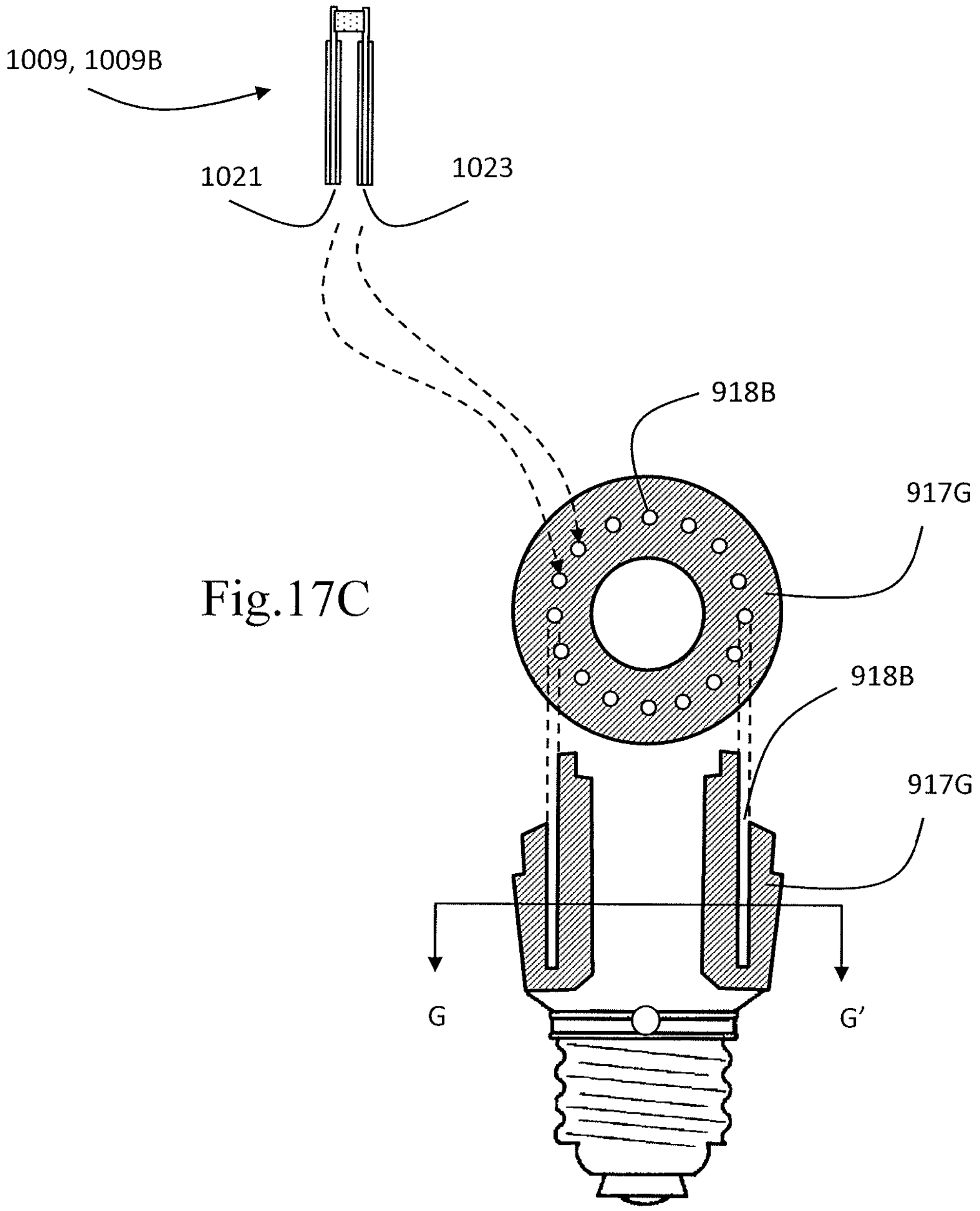
FIGS. 17A~17C shows partial components for a seventh lamp according to the present invention.

FIGS. 17A~17B shows partial components for a seventh lamp according to the present invention.

FIG. 17A is the light unit 1009, 1009B as disclosed in previous section herein can be used in the seventh lamp.

FIG. 17B shows that a heat sink 917G has a pair of longitudinal hole 918B corresponding to the two leads 1021, 1023 of the light unit 1009, 1009B. Each of the two leads 1021, 1023 is then inserted into the holes 918B of the heat sink 917G.

FIG. 17C shows a section view of the heat sink 917G according to line GG'. FIG. 17C shows that the heat sink 917G has a plurality of longitudinal hole 918B for accommodating the two leads 1021, 1023 of the light unit 1009, 1009B.

Figures 18A, 18B:
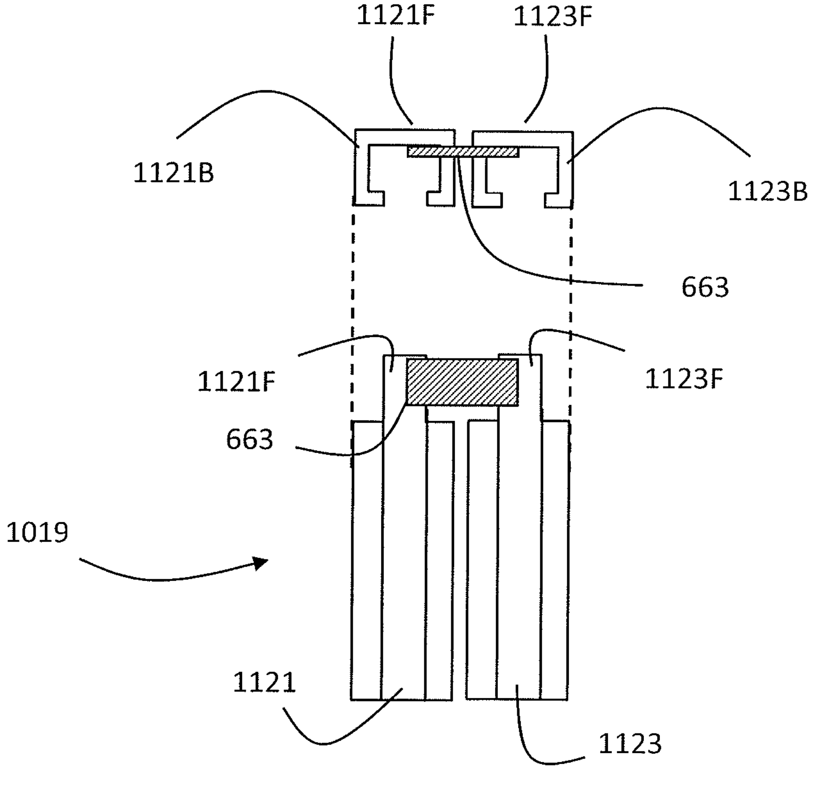
FIGS. 18A~18B is a further light unit according to the present invention.

FIGS. 18A~18B is a further light unit according to the present invention.

FIG. 18A is a light unit 1019 which has a first lead 1121 and a second lead 1123. A light chip 663 straddles a flat top of the lead 1121 and a flat top of the lead 1123.

FIG. 18B is a top view of FIG. 18A. FIG. 18B shows the first lead 1121 has a flat top 1121F and two bracket arms 1121B. A first bracket arm 1121B extends from a left side of the flat top 1121F, a second bracket arm 1121B extends from a right side of the flat top 1121F. Similarly, the second lead 1123 has a flat top 1123F and two bracket arms 1123B. A first bracket arm 1123B extends from a left side of the flat top 1123F, a second bracket arm 1123A extends from a right side of the flat top 1123F.

FIGS. 19A~19B is a further light unit according to the present invention.

FIG. 19A is a light unit 1019B similar to the one shown in FIG. 18A. FIG. 19A shows that a light chip 663 straddles a flat top of the lead 1121 and a flat top of the lead 1123.

FIG. 19B is a top view of FIG. 19A. FIG. 19B is similar to the one shown in FIG. 18B. The difference is that the bracket arms bend in opposite direction as compared with FIG. 18B. FIG. 19A shows that a light chip 663 straddles on both flat tops of the leads 1121, 1123. FIG. 19B shows that the bracket arms bend backwards, i.e., away from the light chip 663.

Figures 20A, 20B, 20C:
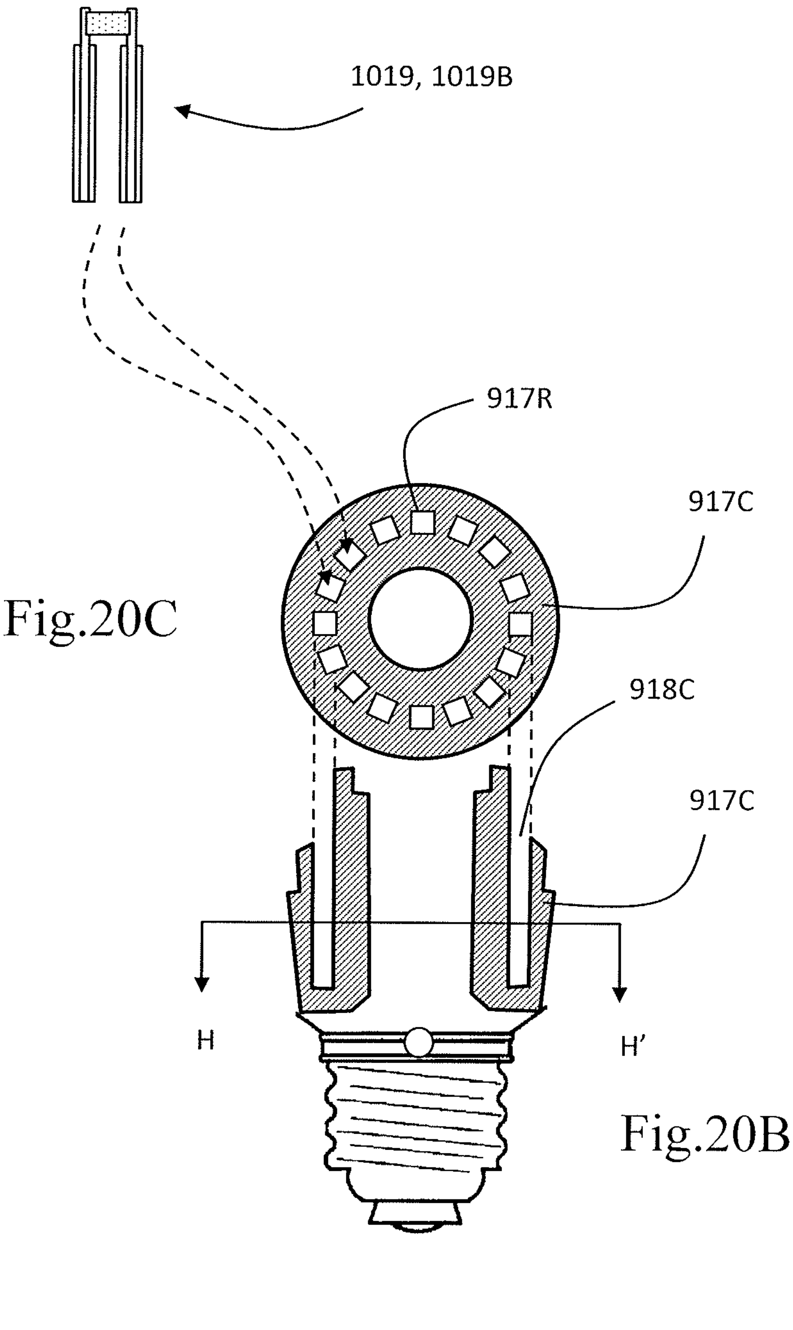
FIGS. 20A~20C shows an eighth lamp according to the present invention.

FIGS. 20A~20B shows an eighth lamp according to the present invention.

FIG. 20A is the light unit 1019, 1019B as disclosed in previous section herein can be used for the eighth lamp.

FIG. 20B shows that a heat sink 917C has a pair of longitudinal rectangular hole 917R for accommodating the leads 1121, 1123 of the light unit 1019, 1019B. Each of the leads 1121, 1123 is then inserted into the corresponding rectangular hole 917R of the heat sink 917C.

FIG. 20C shows a section view of the heat sink 917C according to line HH'. FIG. 20C shows that the heat sink 917C has a plurality of longitudinal pair hole 917R for accommodating the leads 1121, 1123 of the light unit 1019, 1019B.

Figures 21A, 21B, 21C:
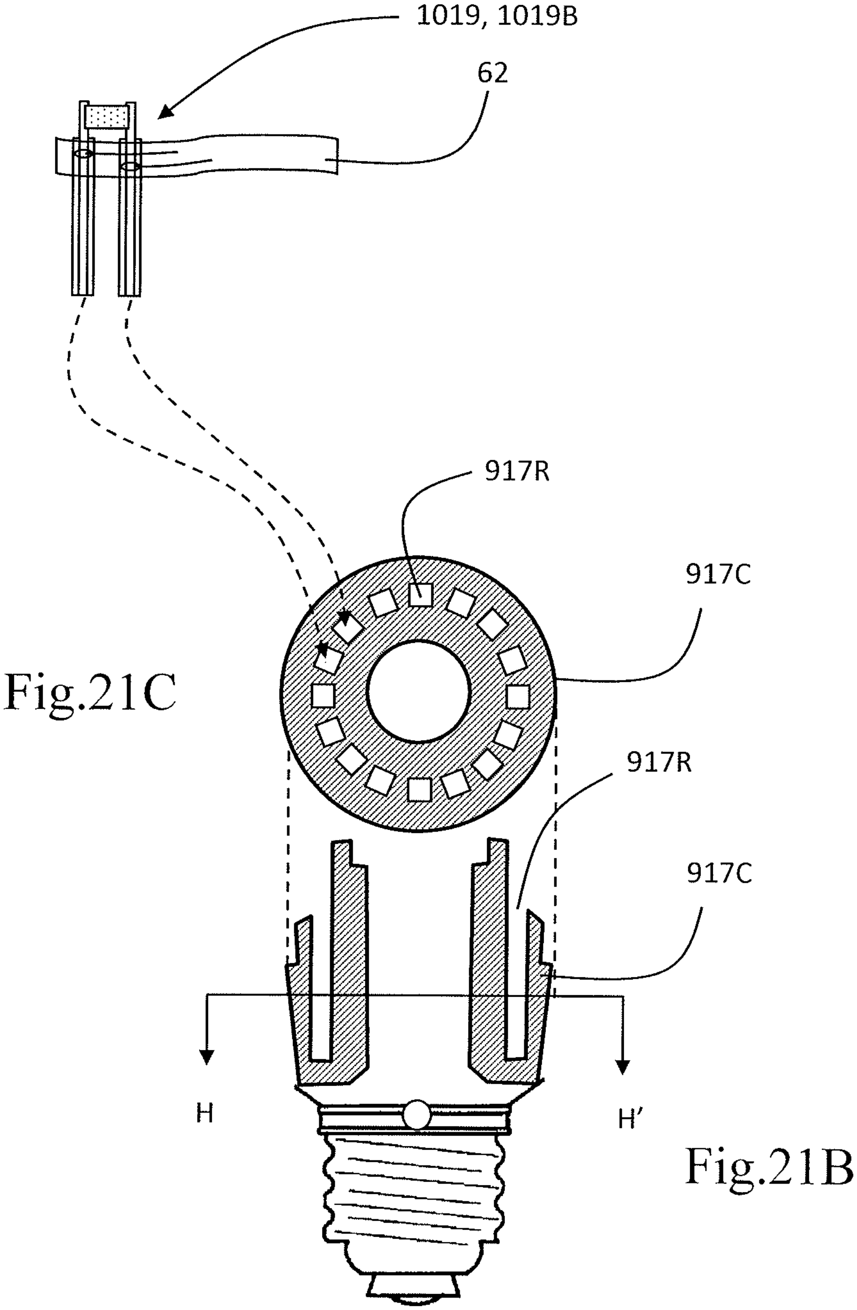
FIGS. 21A~21C shows a ninth lamp according to the present invention.

FIGS. 21A~21B shows a ninth lamp according to the present invention.

FIG. 21A shows that a flexible circuit board 62 can be attached onto the leads of the light unit 1019, 1019B. A plurality of circuit is made on the flexible circuit 62, one of the circuit has a first end electrically coupling to one of the leads 1121, 1123, and has a second end electrically coupling to a power so that the light unit 1019, 1019B can be controlled on/off independently through a control circuit (not shown).

FIG. 21B is the same as FIG. 20B, and FIG. 21C is the same as FIG. 20C. These figures are put here again for an easy understanding to the lamp structure herein described.

FIGS. 22A~22C shows a tenth lamp according to the present invention.

FIG. 22A shows that a hard circuit board 919 can be mounted on the top of the heat sink 917C. A plurality of rectangular through holes 919R is made on the hard circuit board 919 for accommodating the leads of the light unit 1019, 1019B. A plurality of circuit 919C is configured on the circuit board 919 to electrically couple the inserted leads 1121, 1123 to a control circuit (not shown) so that the light unit 1019, 1019B can be controlled on/off independently through the control circuit.

FIG. 22B is the same as FIG. 21B; and FIG. 22C is the same as FIG. 21C. These figures are put here again for an easy understanding to the lamp structure herein described.

FIGS. 23A~23C is a different view to the tenth lamp according to the present invention.

FIG. 23A is a top view of the hard circuit board 919 which is mounted on top of the heat sink 917C.

FIG. 23B is a side view of the hard circuit board 919, heat sink 917C, and the lamp base, in top down sequence.

FIG. 23C is a section view of the heat sink 917C according to line KK'.

Figures 24A, 24B, 24C:
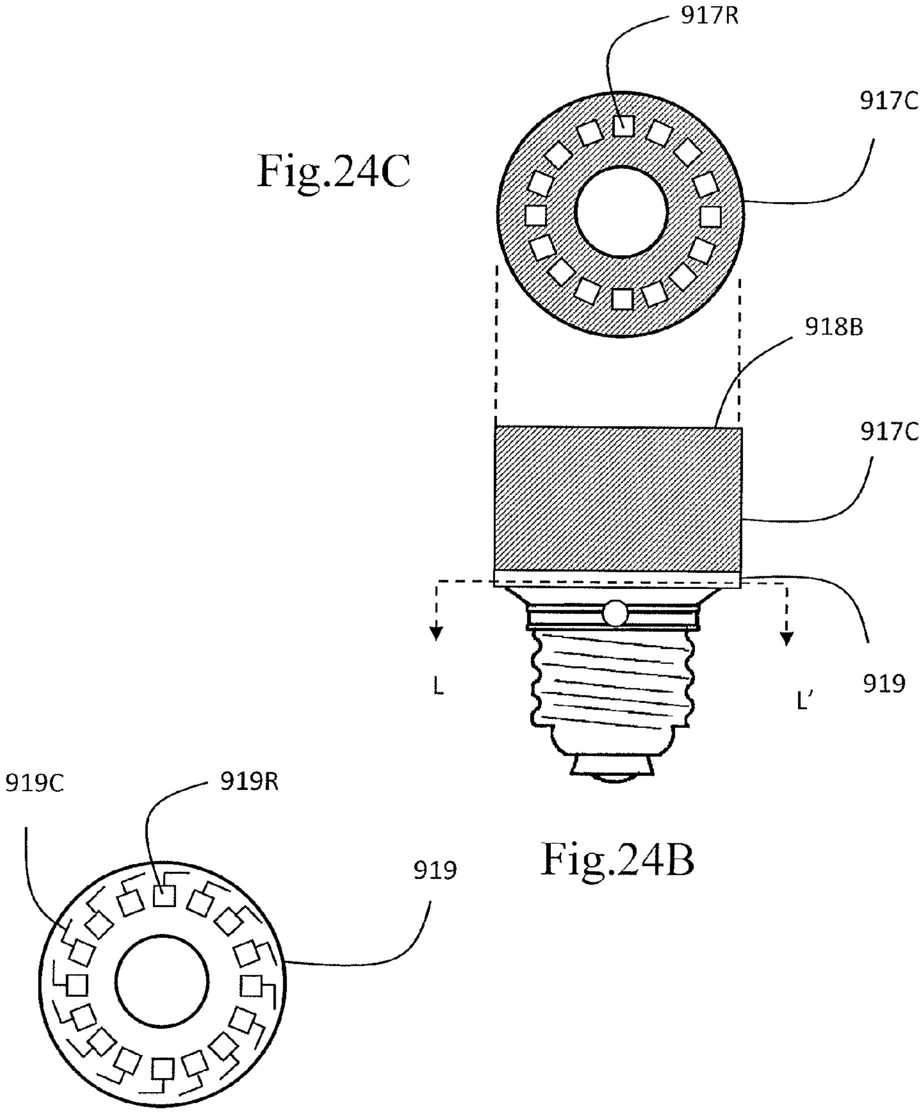
FIGS. 24A~24C is an eleventh lamp according to the present invention.

FIGS. 24A~24C is an eleventh lamp according to the present invention.

The difference between the eleventh lamp of FIG. 24A~24C and the lamp of FIG. 23A~23B is that the position of the hard circuit board 919 is different.

FIG. 24A is a section view of the hard circuit board 919 according to line LL' in FIG. 24B. The hard circuit board 919 is configured on the bottom of the heat sink 917C.

FIG. 24B shows a side view of the lamp that a heat sink 917C, a hard circuit board 919, and a lamp base 66 are configured in a top-down sequence.

FIG. 24C is a top view of the heat sink 917C. FIG. 24C shows the heat sink 917C has a plurality of longitudinal rectangular hole 917R accommodating the leads of the light unit 1019, 1019B.

While several embodiments have been described by way of example, it will be apparent to those skilled in the art that various modifications may be configured without departing from the spirit of the present invention. Such modifications are all within the scope of the present invention, as defined by the appended claims.

What is claimed is:

1. A lamp, comprising:

a light unit, comprising:

a first lead;

a second lead;

a metal slug;

a light chip, mounted on top of the metal slug, and having a first wire bonding to the first lead, and a second wire bonding to the second lead;

a molding compound, wrapping the chip and a bottom of the two leads and a top of the metal slug; and a lens, facing the light chip and exposed out of the molding compound; and a heat sink, contacting the metal slug.

2. A lamp as claimed in claim 1, wherein the heat sink includes a cylindrical wall which has an inner surface and an outer surface; and the metal slug contacts the inner surface of the heat sink.

3. A lamp as claimed in claim 1, wherein the heat sink is made of ceramic.

4. A lamp as claimed in claim 1, wherein the heat sink is made of metal and lined with insulation in between it and the metal slug.

5. A lamp as claimed in claim 1, further comprising:

a transparent cover, configured on top of the heat sink and enclosed the light unit inside; and a lamp base, configured under the heat sink.

6. A lamp as claimed in claim 1, further comprising:

a circuit board, configured inside the cover and electrically coupling to the leads.

7. A lamp as claimed in claim 6, wherein the circuit board is a flexible circuit board.

8. A lamp as claimed in claim 6, wherein the circuit board is a hard circuit board with through holes for the leads to insert.

9. A lamp, comprising:

a heat sink, having an inner cylindrical wall and an outer cylindrical wall;

a center passage, configured inside the inner cylindrical wall and along a longitudinal center line of the heat sink; and a space, configured in between the inner cylindrical wall and the outer cylindrical wall;

a light unit, having a metal part inserted in the space;

a cap, having a further center passage along a longitudinal center line of the cap, the cap configured on top of the heat sink; and a lamp base, configured on a bottom of the heat sink, wherein the cap has a donut shape.

10. A lamp as claimed in claim 9, further comprising:

a hole, configured under the heat sink, and communicated with the center passage of the heat sink;

wherein the further center passage of the cap is communicated with the center passage of the heat sink.

11. A lamp as claimed in claim 9, wherein:

the space of the heat sink includes a pair of longitudinal holes; and the metal part of the light unit includes two leads, each of the leads inserted in one of the longitudinal holes.

12. A lamp as claimed in claim 11, wherein one of the first lead and the second lead has a flat top and has a left arm and a right arm in a lower portion.

13. A lamp as claimed in claim 12, further comprising a light chip, straddle the flat tops of the two leads.

14. A lamp as claimed in claim 11, wherein one of the arm bends forward.

15. A lamp as claimed in claim 11, wherein one of the arm bends backward.

16. A lamp as claimed in claim 11, wherein the arm is of a shape selected from the group consisting of an arc and a rectangle.

17. A lamp as claimed in claim 11, wherein the longitudinal holes have a shape selected from the group consisting of an arc and a bracket.

18. A lamp as claimed in claim 11, further comprising:

a circuit board electrically coupling to the leads.

19. A lamp as claimed in claim 18, wherein the circuit board is a flexible circuit board.

20. A lamp as claimed in claim 18, wherein the circuit board is a hard circuit board with through holes for the leads to insert.

21. A lamp as claimed in claim 20, wherein the hard circuit board is configured on top of the heat sink.

22. A lamp as claimed in claim 20, wherein the hard circuit board is configured on bottom of the heat sink.

23. A lamp, comprising:

a heat sink, having an inner cylindrical wall and an outer cylindrical wall; and a slit, configured in between the inner cylindrical wall and the outer cylindrical wall;

a light unit, having a metal slug inserted in the slit;

a cap, configured on top of the heat sink; and a lamp base, configured on a bottom of the heat sink, wherein the cap is selected from the group consisting of an elliptical shape and a donut shape.

24. A lamp as claimed in claim 23, further comprising:

a hole, configured under the heat sink, communicated with a center passage of the inner cylindrical wall; and a further center passage of the cap, communicated with the center passage of the inner cylindrical wall.

25. A lamp as claimed in claim 24, further comprising:

a dissipation fin, extended from the inner cylindrical wall inwardly into the center passage of the inner cylindrical wall.

26. A lamp, comprising:

a heat sink, having an inner cylindrical wall and an outer cylindrical wall; and a slit, configured in between the inner cylindrical wall and the outer cylindrical wall;

a light unit, having a metal slug inserted in the slit;

a cap, configured on top of the heat sink;

a lamp base, configured on a bottom of the heat sink;

a hole, configured under the heat sink, communicated with a center passage of the inner cylindrical wall;

a further center passage of the cap, communicated with the center passage of the inner cylindrical wall; and a dissipation fin, extended from the inner cylindrical wall inwardly into the center passage of the inner cylindrical wall.

* * * * *